US012787792B2

(12) United States Patent
Cho

(10) Patent No.: US 12,787,792 B2
(45) Date of Patent: Nov. 3, 2026

(54) TRANSMISSION LINE STRUCTURE WITH PROTRUDING SUB-LINES AND DIELECTRIC MATERIAL ZONES FOR RF SIGNAL

(71) Applicant: Taiwan Semiconductor Manufacturing Company, Ltd., Hsinchu (TW)

(72) Inventor: Hsiu-Ying Cho, Hsin Chu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 19/250,796

(22) Filed: Jun. 26, 2025

(65) Prior Publication Data

US 2025/0323185 A1 Oct. 16, 2025

Related U.S. Application Data

(63) Continuation of application No. 17/716,050, filed on Apr. 8, 2022, now Pat. No. 12,394,734.

(51) Int. Cl.
*H10W 44/20* (2026.01)
*H01P 3/08* (2006.01)

(52) U.S. Cl.
CPC ............... *H10W 44/20* (2026.01); *H01P 3/08* (2013.01); *H10W 44/216* (2026.01)

(58) Field of Classification Search
CPC ....... H10W 44/20; H10W 44/216; H01P 3/08; H01P 3/003
See application file for complete search history.

(56) References Cited

U.S. PATENT DOCUMENTS

2009/0195327 A1 8/2009 Cho
2012/0274424 A1 11/2012 Cho
2020/0118781 A1 4/2020 Wang

*Primary Examiner* — Norman D Richards
*Assistant Examiner* — Ethan Edward Cutler
(74) *Attorney, Agent, or Firm* — McClure, Qualey & Rodack, LLP

(57) ABSTRACT

Transmission line structures are provided. The first and second conductive lines extend in a first direction. The first transmission line includes a first sub-line extending in the first direction and second sub-lines extending toward the first conductive line. The second sub-lines include first, second, and third groups. The first dielectric material zones are formed between the second sub-lines of the first group and the first conductive line. The second dielectric material zones are formed between the second sub-lines of the second group and the first conductive line. The third dielectric material zones are formed between the second sub-lines of the third group and the first conductive line. The second sub-lines of the first and second groups are interleaved along a first segment of the first sub-line. The second sub-lines of the first and third groups are interleaved along a second segment of the first sub-line.

20 Claims, 12 Drawing Sheets

| | Ground line 20b | Transmission line 30b (switch 330) | Transmission line 10a (switch 310) | Transmission line 30a (switch 320) | Ground line 20a |
|---|---|---|---|---|---|
| $\lambda\_a_1$ | ground | ON | ON | ON | ground |
| $\lambda\_a_2$ | ground | ON | ON | ground | ground |
| $\lambda\_a_3$ | ground | ON | ground | ON | ground |
| $\lambda\_a_4$ | ground | ground | ON | ON | ground |
| $\lambda\_a_5$ | ground | ON | ground | ground | ground |
| $\lambda\_a_6$ | ground | ground | ground | ON | ground |
| $\lambda\_a_7$ | ground | ground | ON | ground | ground |

FIG. 6B

| | Ground line 20b | Transmission line 30b (switch 330) | Transmission line 10a (switch 310) | Transmission line 30a (switch 320) | Ground line 20a |
|---|---|---|---|---|---|
| $\lambda\_b_1$ | ground | ON | ON | ON | ground |
| $\lambda\_b_2$ | ground | ON | ON | ground | ground |
| $\lambda\_b_3$ | ground | ON | ground | ON | ground |
| $\lambda\_b_4$ | ground | ground | ON | ON | ground |
| $\lambda\_b_5$ | ground | ON | ground | ground | ground |
| $\lambda\_b_6$ | ground | ground | ground | ON | ground |
| $\lambda\_b_7$ | ground | ground | ON | ground | ground |

FIG. 7B

| | Ground line 20b | Transmission line 30b (switch 330) | Transmission line 10b (switch 340) | Transmission line 10a (switch 310) | Transmission line 30a (switch 320) | Ground line 20a |
|---|---|---|---|---|---|---|
| $\lambda\_c_1$ | ground | ON | ON | ON | ON | ground |
| $\lambda\_c_2$ | ground | ON | ON | ground | ON | ground |
| $\lambda\_c_3$ | ground | ON | ground | ON | ON | ground |
| $\lambda\_c_4$ | ground | ground | ON | ON | ON | ground |
| $\lambda\_c_5$ | ground | ON | ground | ground | ON | ground |
| $\lambda\_c_6$ | ground | ground | ground | ON | ON | ground |
| $\lambda\_c_7$ | ground | ground | ON | ground | ON | ground |
| $\lambda\_c_8$ | ground | ON | ON | ON | ground | ground |
| $\lambda\_c_9$ | ground | ON | ON | ground | ground | ground |
| $\lambda\_c_{10}$ | ground | ON | ground | ON | ground | ground |
| $\lambda\_c_{11}$ | ground | ground | ON | ON | ground | ground |
| $\lambda\_c_{12}$ | ground | ON | ground | ground | ground | ground |
| $\lambda\_c_{13}$ | ground | ground | ground | ON | ground | ground |
| $\lambda\_c_{14}$ | ground | ground | ON | ground | ground | ground |
| $\lambda\_c_{15}$ | ground | ground | ground | ground | ON | ground |

FIG. 8B

TRANSMISSION LINE STRUCTURE WITH PROTRUDING SUB-LINES AND DIELECTRIC MATERIAL ZONES FOR RF SIGNAL

CROSS REFERENCE TO RELATED APPLICATIONS

This application is a Continuation of pending U.S. application Ser. No. 17/716,050, filed on Apr. 8, 2022, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also emphasized the importance of managing the transmission of radio frequency signals within such ICs. Coplanar waveguide (CPW) structures are often utilized for such transmission.

The parasitic of radio frequency (RF) on-chip passive components cannot be scaled as readily as the parasitic that accompanies active devices, such as transistors. In most circuit designs, the direct application of conventional transmission lines is not realistic as the electromigration (EM) wavelength is too long. For example, the electromagnetic wavelength in a $SiO_2$ dielectric material is 3000 μm at 50 GHz, which is area-consuming for the application of impedance matching networks of quarter-wavelength long transmission lines.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 6B shows a wavelength table of the transmission line structure of FIG. 6A, in accordance with some embodiments of the disclosure.

FIG. 7B shows a wavelength table of the transmission line structure of FIG. 7A, in accordance with some embodiments of the disclosure.

FIG. 8B shows a wavelength table of the transmission line structure of FIG. 8A, in accordance with some embodiments of the disclosure.

DETAILED DESCRIPTION

Figure 1A:
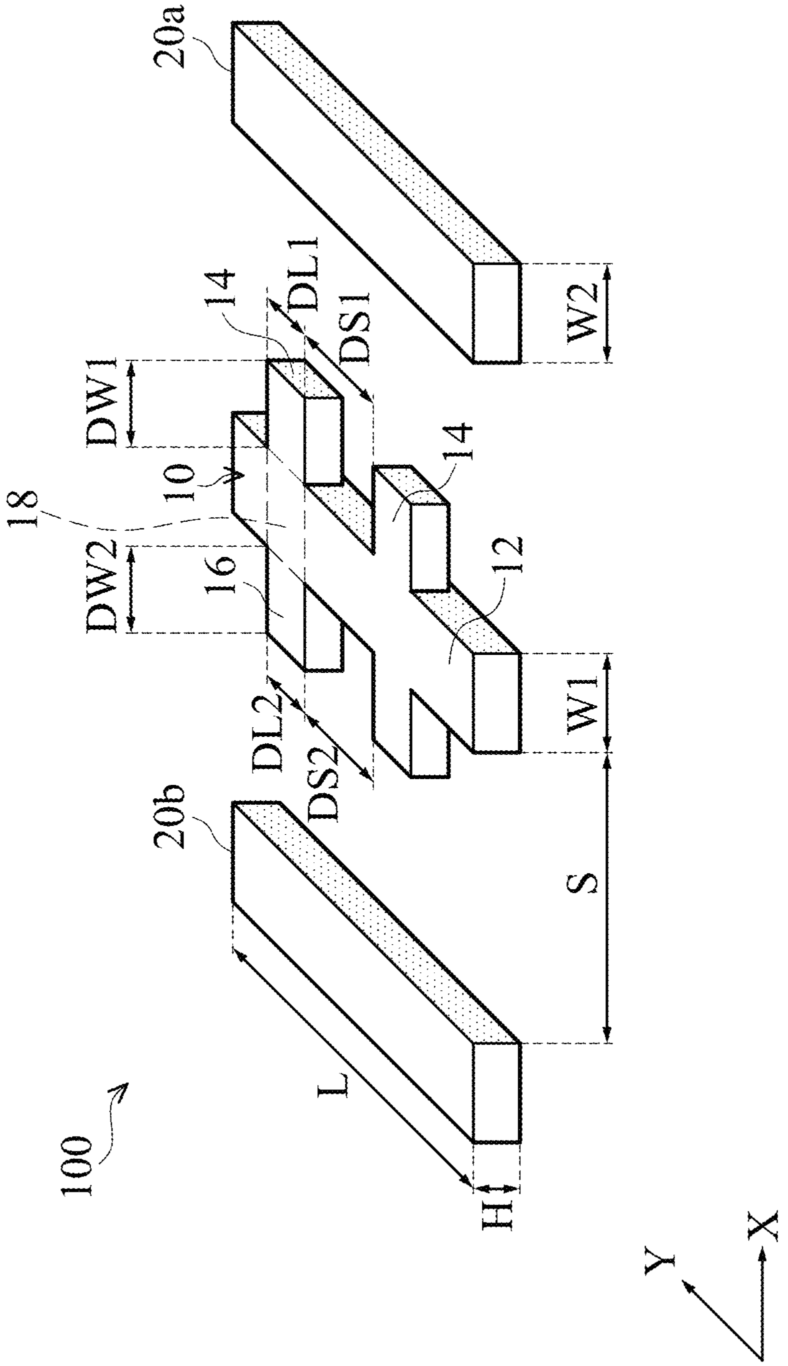
FIG. 1A shows a perspective view of a transmission line structure, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as “beneath,” “below,” “lower,” “above,” “upper” and the like, may be used herein for ease of description to describe one element or feature’s relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a perspective view of a transmission line structure 100, in accordance with some embodiments of the disclosure. The transmission line structure 100 is a coplanar waveguide structure in semiconductor device, and the transmission line structure 100 includes the transmission line 10 and the conductive lines 20*a* and 20*b*. In such embodiment, the transmission line 10 is a signal line disposed between the conductive lines 20*a* and 20*b*. Furthermore, the transmission line 10 is coupled to a wave source. The wave source may be any suitable frequency. For example, the wave source may include a radio frequency radio frequency signal Source, a transmitter, a transceiver, or an antenna. In some embodiments, the transmission line 10 carries a radio frequency signal along its length. In some embodiments, the transmission line 10 may be designed to carry a radio frequency signal in the microwave and/or millimeter range (for example, frequencies between about 300 MHz and about 300 GHz).

The conductive lines 20*a* and 20*b* are relatively static lines. In such embodiment, the conductive lines 20*a* and 20*b* are electrically coupled to ground, and thus, the conductive lines 20*a* and 20*b* may also be referred to as the ground lines. In some embodiments, the conductive lines 20*a* and 20*b* may be coupled to a fixed voltage source. In some embodiments, the conductive lines 20*a* and 20*b* may be coupled to an AC or DC voltage source, including a reference voltage source. In other words, a reference voltage (or a fixed voltage) is applied to the conductive lines 20*a* and 20*b*.

The transmission line 10 is composed of any material capable of propagating a radio frequency signal. The conductive lines 20*a* and 20*b* are composed of any material capable of shielding. For example, the transmission line 10 and/or the conductive lines 20*a* and 20*b* may include metal, such as aluminum, copper, tungsten, titanium, tantalum, titanium nitride, tantalum nitride, nickel silicide, cobalt silicide, silver, TaC, TaSiN, TaCN, TiAl, TiAlN, metal alloys, other suitable materials, or a combination thereof. It should be understood that the transmission line 10 may include the same or different material as the conductive lines 20*a* and 20*b*. Moreover, the conductive line 20*a* may include the same or different material as the conductive line 20*b*. In such embodiment, the transmission line 10 is separated from the conductive lines 20*a* and 20*b* by an insulation material, a dielectric material or other suitable material.

The conductive lines 20*a* and 20*b* are oriented parallel to one another in the Y direction. In such embodiment, the conductive lines 20*a* and 20*b* extend a distance L in the Y direction, and the conductive lines 20*a* and 20*b* have a height H. In some embodiments, the conductive lines 20*a* and 20*b* may extend longitudinally varying distances L, and the conductive lines 20*a* and 20*b* may have varying heights H. Similarly, the height H of the conductive lines 20*a* and 20*b* may be the same or different. In such embodiment, the conductive lines 20*a* and 20*b* has the same width W2 in the X-direction. In some embodiments, the conductive lines 20*a* and 20*b* have different widths W2. In some embodiments, the width W2 of the conductive lines 20*a* and 20*b* is wider than the height H of the conductive lines 20*a* and 20*b*. In some embodiments, the height H of the conductive lines 20*a* and 20*b* is larger than or equal to the width W2 of the conductive lines 20*a* and 20*b*.

In the transmission line structure 100, the dimension of the transmission line 10 varies along the Y-direction. The transmission line 10 includes a sub-line (or a main segment) 12 extending in the Y-direction and multiple sub-lines 14 and 16 extending in the X-direction. The sub-line 12 has a width W1 in the X-direction. The width W1 of the sub-line 12 may be equal to or different from the width W2 of the conductive lines 20*a* and 20*b*. Each sub-line 14 extends from the sub-line 12 toward the conductive line 20*a* in the X-direction. The sub-lines 14 have a width DW1 in the X-direction and a length DL1 in the Y-direction. Moreover, the sub-lines 14 are periodically arranged on and contact the sub-line 12 along the Y direction at intervals of space DS1. Each sub-line 16 extends from the sub-line 12 toward the conductive line 20*b* in the X-direction. The sub-lines 16 have a width DW2 in the X-direction and a length DL2 in the Y-direction. Moreover, the sub-lines 16 are periodically arranged on and contact the sub-line 12 along the Y direction at intervals of space DS2. In some embodiments, if the length DL1 of the sub-line 14 is equal to the length DL2 of the sub-line 16 and the space DS1 is equal to the space DS2, the sub-lines 14 and 16 combined with the segment 18 can be regarded as a sub-line intersecting the sub-line 12.

In FIG. 1A, the sub-lines 14 and 16 have rectangular shape. In other embodiments, the sub-lines 14 and 16 may form an elliptical shape, a semi-circular shape, a triangular shape, other suitable shape, or a combination thereof. It should be understood that the sub-lines 14 may have different dimensions, and the sub-lines 16 may have different dimensions. In some embodiments, some sub-lines 14 and/or 16 are omitted. In other words, the number of the sub-lines 14 is different from the number of the sub-lines 16.

Figure 1B:
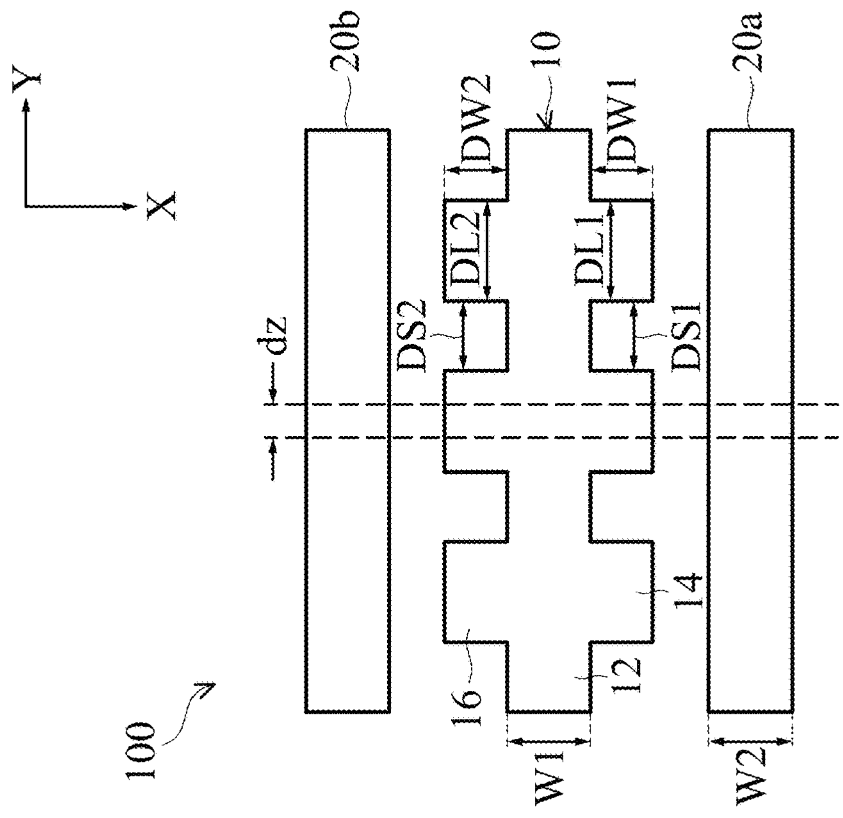
FIG. 1B shows a top view of the transmission line structure of FIG. 1A, in accordance with some embodiments of the disclosure.

The dimensions of the transmission line structure 100 may be selected to provide the desired signal characteristics, e.g., the desired phase velocity as described below. The electrical and radio frequency characteristics of the transmission line structure 100 in FIG. 1A will be described by making reference to FIGS. 1B, 1C and 1D. Using distributed circuit theory, the transmission line structure 100 may be modeled using a series of equivalent circuits. For each differential unit length dz, the transmission line structure 100 may be treated as if it included an equivalent circuit, such as the equivalent circuit illustrated in FIGS. 1C and 1D. The equivalent circuit has an inductance per unit length L' and a capacitance per unit length C'. Thus, the transmission line structure 100 may be described using line parameters based on electric circuit concepts.

The values of inductance per unit length L' and capacitance per unit length C' may be determined from the physical characteristics of the transmission line structure 100, including its physical dimensions and material composition. The phase velocity Vp of a wave traveling along the signal line 10 may be expressed as:

$$V_p = \frac{c}{\sqrt{\varepsilon_r' \mu_r}} = \frac{1}{n/2\sqrt{L'C'}} = f\lambda,$$

where c is the velocity of light, $\varepsilon'_r$ is the relative permittivity, and $\mu_r$ is the relative permeability. Thus, to design a coplanar waveguide structure to have the desired phase velocity, the materials for the coplanar waveguide may be chosen to provide the desired relative permittivity and permeability. Alternately, the coplanar waveguide structure may be dimensioned to provide the desired inductance and capacitance using the structures disclosed herein.

Figure 1C:
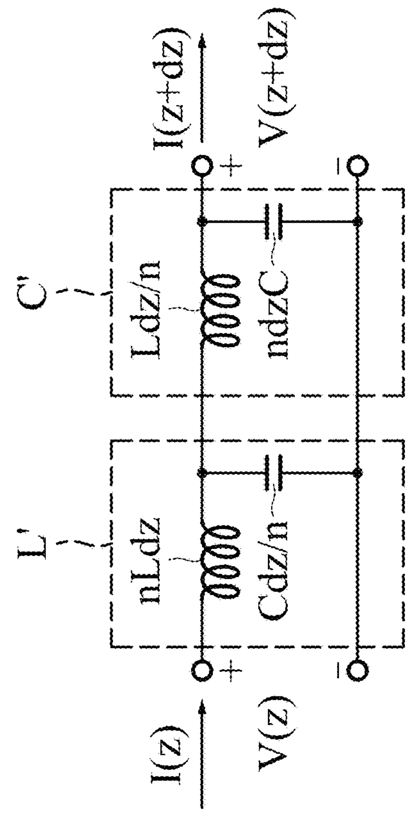
FIGS. 1C and 1D show the equivalent circuit of the transmission line structure of FIG. 1A, in accordance with some embodiments of the disclosure.
Figure 1D:
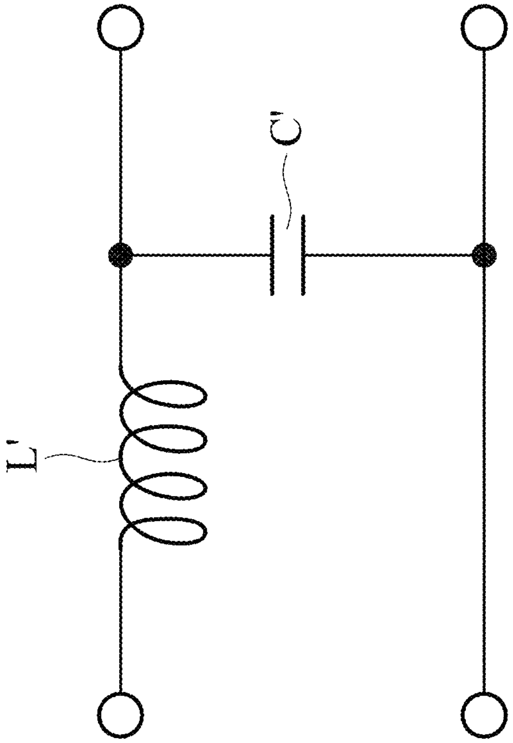

In such embodiments, the periodic structure formed by the sub-lines 12, 14 and 16, provides alternating respective high and low impedance sections as illustrated in the equivalent circuit shown in FIG. 1C and FIG. 1D. If the alternating high and low impedance sections are short in length compared to the wavelength, and the alternating segments are cascaded together, the inductance is dominated by the high impedance section, and the capacitance is dominated by the low impedance section. The periodical structure within the transmission line 10 essentially provides the ability to have a higher permittivity epsilon $\varepsilon_r$ and adjust the wavelength $\lambda$. Accordingly, the permittivity epsilon $\varepsilon_r$ can be varied by different transmission line structures, such as the various embodiments presented herein. In some embodiments, the higher epsilon coplanar waveguide structures may be incorporated into microwave and millimeter wave integrated circuits (ICs), such as circuit impedance matching circuits of the quarter wavelength long transmission line, GPS satellite systems and wireless communication.

The following discussion provides various transmission line structures that may provide a higher permittivity epsilon $\varepsilon_r$ and result in an adjusting wavelength λ.

Figure 2B:
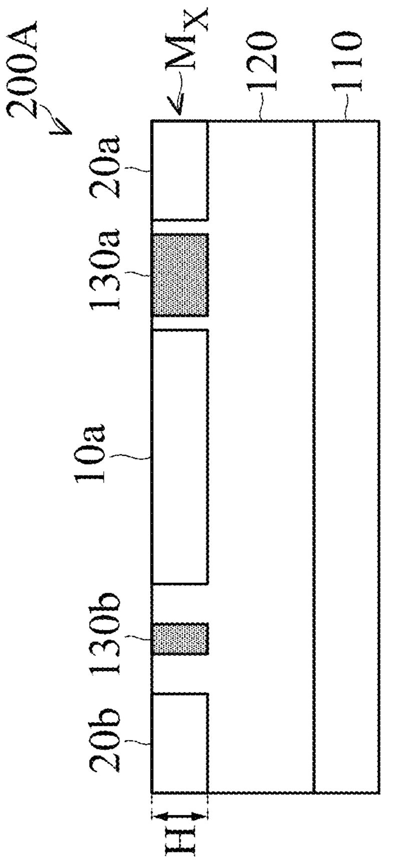
FIG. 2B shows a cross-sectional view of the transmission line structure along line A-AA in FIG. 2A, in accordance with some embodiments of the disclosure.
Figure 2A:
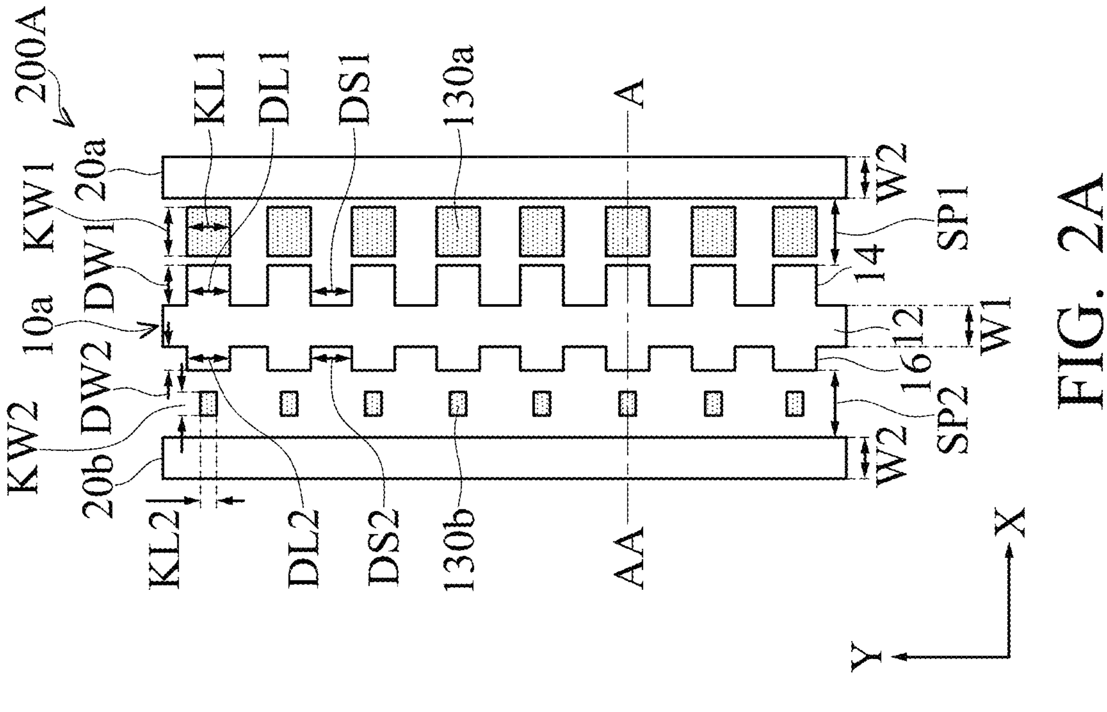
FIG. 2A shows a top view of a transmission line structure, in accordance with some embodiments of the disclosure.

FIG. 2A shows a top view of a transmission line structure 200A, in accordance with some embodiments of the disclosure. The configuration of the transmission line structure 200A in FIG. 2A is similar with the configuration of the transmission line structure 100 in FIG. 1A. The difference between the transmission line structure 200A in FIG. 2A and the transmission line structure 100 in FIG. 1A is that the transmission line structure 200A further includes the dielectric material zones 130. The dielectric material zones 130 are divided into the dielectric material zones 130*a* with larger area and the dielectric material zones 130*b* with smaller area. In such embodiment, the dielectric material zones 130*a* and 130*b* are formed by the same high-k dielectric material, e.g., k>15 or 7≤k≤15. In some embodiments, the high-k dielectric material, may include metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable high-k dielectric materials, or a combination thereof.

In the transmission line structure 200A, the transmission line 10*a* includes the sub-line 12, the sub-lines 14 closed to the conductive line 20*a*, and the sub-lines 16 closed to the conductive line 20*b*. The length DL1 of the sub-line 14 is equal to the length DL2 of the sub-line 16 (i.e., DL1=DL2), and the width DW1 of the sub-line 14 is larger than the width DW2 of the sub-line 16 (i.e., DW1>DW2). Thus, the area of the sub-line 14 is greater than the area of the sub-line 16. Furthermore, the space between the sub-line 14 and the conductive line 20*a* is SP1, and the space between the sub-line 16 and the conductive line 20*b* is SP2. In some embodiments, the space SP1 is equal to the space SP2 (i.e., SP1=SP2). In some embodiments, the space SP1 is different from to the space SP2 (i.e., SP1>SP2 or SP1<SP2). If the space SP1 is equal to the space SP2, a distance between the conductive line 20*a* and the sub-line 12 is greater than a distance between the conductive line 20*b* and the sub-line 12 because the width DW1 of the sub-line 14 is greater than the width DW2 of the sub-line 16.

In FIG. 2A, the dielectric material zones 130*a* have a width KW1 in the X-direction and a length KL1 in the Y-direction, and the dielectric material zones 130*b* have a width KW2 in the X-direction and a length KL2 in the Y-direction. In such embodiment, the width KW1 is greater than the width KW2 (i.e., KW1>KW2), and the length KL1 is greater than the length KL2 (i.e., KL1>KL2). Thus, the area of the dielectric material zones 130*a* is greater than the area of the dielectric material zones 130*b*.

In FIG. 2A, the dielectric material zones 130*a* are disposed between the sub-lines 14 of the transmission line 10*a* and the conductive line 20*a*, and the dielectric material zones 130*b* are disposed between the sub-lines 16 of the transmission line 10*a* and the conductive line 20*b*. In the transmission line structure 200A, the dielectric material zones 130*a* disposed between the sub-lines 14 and the conductive line 20*a* have the same area, and the dielectric material zones 130*b* disposed between the sub-lines 16 and the conductive line 20*b* have the same area. In such embodiments, the sub-lines 14 and 16 and the dielectric material zones 130*a* and 130*b* have the same number.

FIG. 2B shows a cross-sectional view of the transmission line structure 200A along line A-AA in FIG. 2A, in accordance with some embodiments of the disclosure. In FIG. 2B, an insulation material layer 120 is formed over a semiconductor substrate 110. In some embodiments, the semiconductor substrate 110 is a Si substrate. In some embodiments, the material of the semiconductor substrate 15 is selected from a group consisting of bulk-Si, SiP, SiGe, SiC, SiPC, Ge, SOI—Si, SOI—SiGe, III-VI material, or a combination thereof. In some embodiments, the insulation material layer 120 may be an inter-layer dielectric (ILD) layer or an inter-metal dielectric (IMD) layer. Furthermore, the insulation material layer 120 may include any suitable material and any suitable thickness. In some embodiments, the insulation material layer 120 includes a dielectric material, such as TEOS oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, PSG, BPSG, other suitable dielectric materials, or a combination thereof.

The transmission line 10*a* and the conductive lines 20*a* and 20*b* are formed in a metal layer Mx. Furthermore, the metal layer Mx may be a top metal layer, an intermediate metal layer or a lower metal layer. The transmission line 10*a* and the conductive lines 20*a* and 20*b* are separated from each other by the insulation material layer 120. The dielectric material zone 130*a* is formed in the insulation material layer 120 and between the transmission line 10*a* and the conductive line 20*a*, and the dielectric material zone 130*b* is formed in the insulation material layer 120 and between the transmission line 10*a* and the conductive line 20*b*. In other words, the dielectric material zones 130*a* and 130*b* are separated from the transmission line 10*a* and the conductive lines 20*a* and 20*b* by the insulation material layer 120. In such embodiment, the transmission line 10*a*, the conductive lines 20*a* and 20*b* and the dielectric material zones 130*a* and 130*b* have the height H and are formed in the save level. In some embodiments, the height of the dielectric material zones 130*a* and 130*b* is different from the height H of the transmission line 10*a* and the conductive lines 20*a* and 20*b*.

As described above, the dielectric material zones 130*a* and 130*b* are formed by the same high-k dielectric material. Furthermore, the dielectric constant of the dielectric material zones 130*a* and 130*b* is greater than the dielectric constant of insulation material layer 120.

Figure 3:
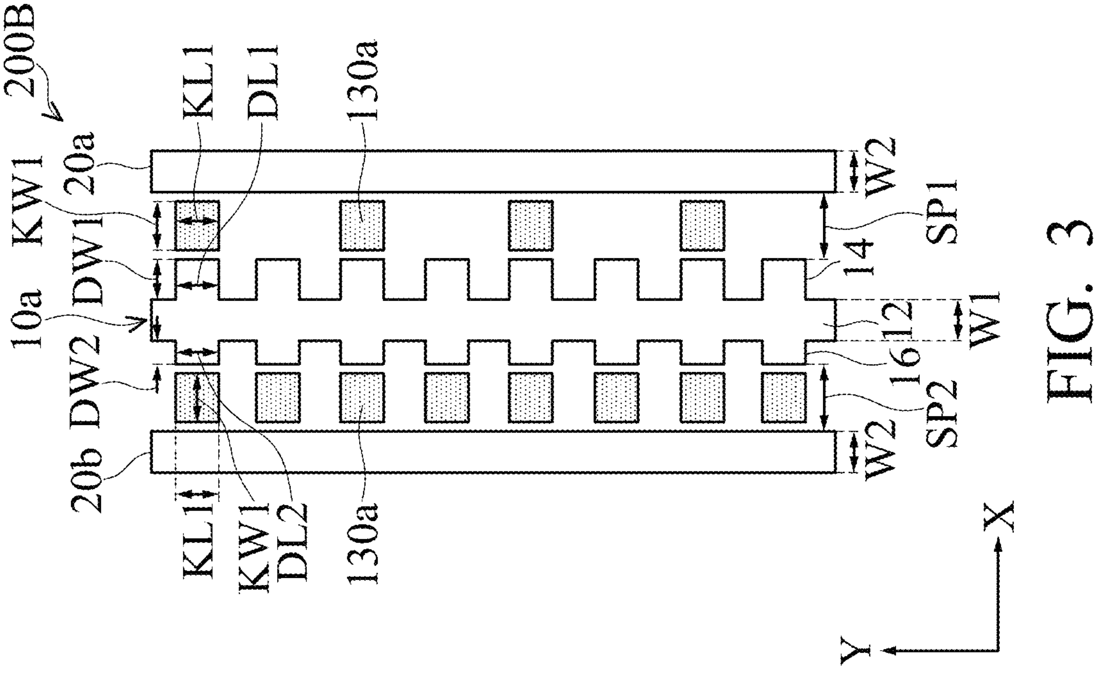
FIG. 3 shows a top view of a transmission line structure, in accordance with some embodiments of the disclosure.

FIG. 3 shows a top view of a transmission line structure 200B, in accordance with some embodiments of the disclosure. The transmission line structure 200B includes the dielectric material zones 130*a*. In other words, no dielectric material zone 130*b* is formed in the transmission line structure 200B.

In the transmission line structure 200B, the number of dielectric material zones 130*a* between the transmission line 10*a* and the conductive line 20*a* is less than the number of dielectric material zones 130*a* between the transmission line 10*a* and the conductive line 20*b*. For example, the number of dielectric material zones 130*a* between the transmission line 10*a* and the conductive line 20*a* is half the number of dielectric material zones 130*a* between the transmission line 10*a* and the conductive line 20*b*. In other words, the dielectric material zones 130*a* are only configured between a portion of the sub-lines 14 and the conductive line 20*a*.

Figure 4:
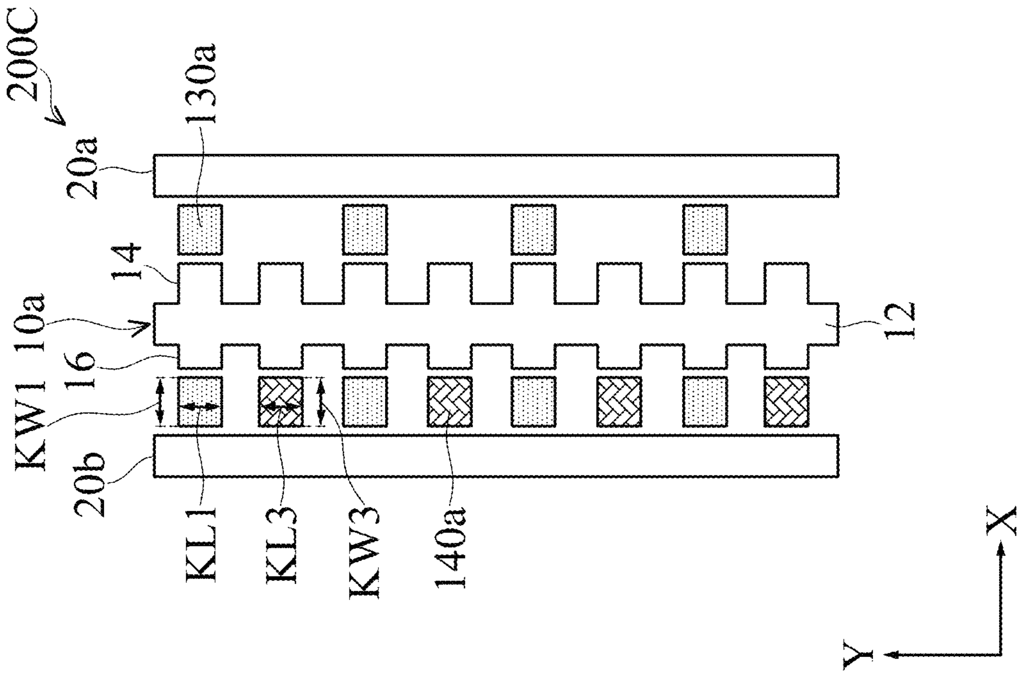
FIG. 4 shows a top view of a transmission line structure, in accordance with some embodiments of the disclosure.

FIG. 4 shows a top view of a transmission line structure 200C, in accordance with some embodiments of the disclosure. The configuration of the transmission line structure 200C in FIG. 4 is similar with the configuration of the transmission line structure 200B in FIG. 3. The difference between the transmission line structure 200B in FIG. 3 and the transmission line structure 200C in FIG. 4 is that the transmission line structure 200C further includes the dielectric material zones 140*a*.

In FIG. 4, the dielectric material zones 130*a* have the width KW1 in the X-direction and the length KL1 in the Y-direction, and the dielectric material zones 140*a* have a width KW3 in the X-direction and a length KL3 in the Y-direction. In such embodiment, the width KW1 is equal to the width KW3 (i.e., KW1=KW3), and the length KL1 is equal to the length KL3 (i.e., KL1=KL3). Thus, the area of the dielectric material zones 130*a* is equal to the area of the dielectric material zones 140*a*.

The dielectric material zones 130*a* and 140*a* are formed by different high-k dielectric materials. For example, the dielectric material zones 130*a* are formed by a first high-k dielectric material, and the dielectric material zones 140*a* are formed by a second high-k dielectric material. In some embodiments, the dielectric constant of the first high-k dielectric material is less than the dielectric constant of the second high-k dielectric material. For example, the dielectric constant of the first high-k dielectric material is between 7 and 15, and the dielectric constant of the second high-k dielectric material is greater than 15. Moreover, the dielectric constant of the first/second high-k dielectric material is greater than the dielectric constant of insulation material layer 120 of FIG. 2B. In some embodiments, the dielectric constant of the first high-k dielectric material is greater than the dielectric constant of the second high-k dielectric material. For example, the dielectric constant of the first high-k dielectric material is greater than 15, and the dielectric constant of the second high-k dielectric material is between 7 and 15.

In the transmission line structure 200C, the dielectric material zones 130*a* and 140*a* with different dielectric constant are disposed between the transmission line 10*a* and the conductive line 20*b*, and the dielectric material zones 130*a* with same dielectric constant are disposed between the transmission line 10*a* and the conductive line 20*a*. In some embodiments, the dielectric material zones 130*a* and 140*a* are interleaved between the transmission line 10*a* and the conductive line 20*b* along the Y-direction. Furthermore, only the dielectric material zones 130*a* are disposed between the transmission line 10*a* and the conductive line 20*a* along the Y-direction. Moreover, no dielectric material zone is formed between the dielectric material zones 140*a* and the conductive line 20*a* in the X-direction.

Figure 5:
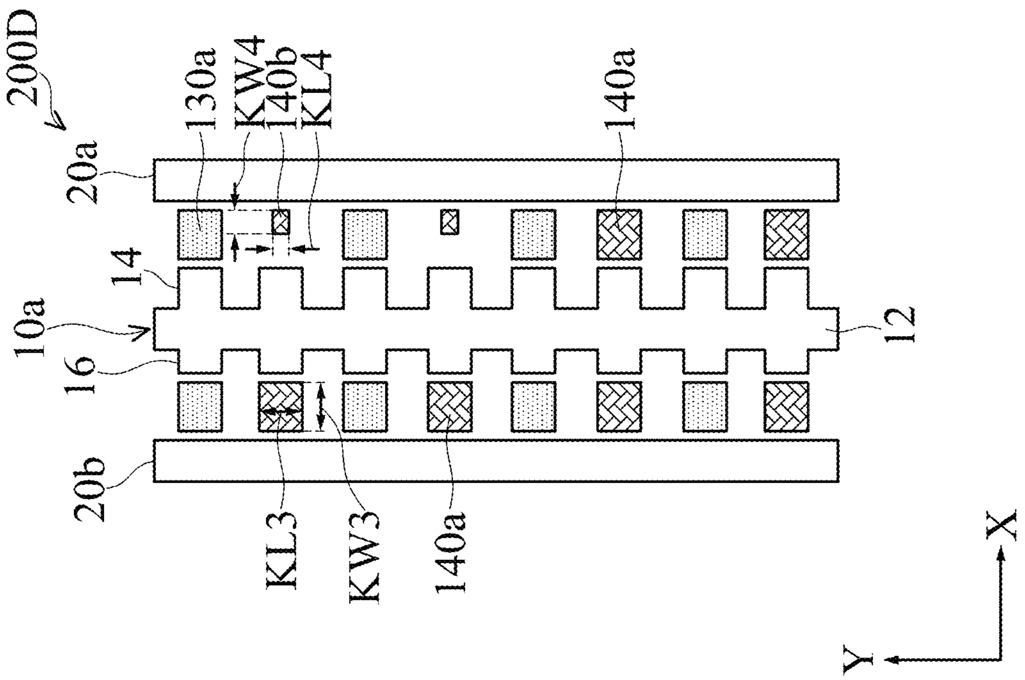
FIG. 5 shows a top view of a transmission line structure, in accordance with some embodiments of the disclosure.

FIG. 5 shows a top view of a transmission line structure 200D, in accordance with some embodiments of the disclosure. The configuration of the transmission line structure 200D in FIG. 5 is similar with the configuration of the transmission line structure 200C in FIG. 4. The difference between the transmission line structure 200C in FIG. 4 and the transmission line structure 200D in FIG. 5 is that the transmission line structure 200D further includes the dielectric material zones 140*b*.

In FIG. 5, the dielectric material zones 140*a* and 140*b* are formed by the same high-k dielectric materials. Furthermore, the dielectric material zones 140*b* have a width KW4 in the X-direction and a length KL4 in the Y-direction. In such embodiment, the width KW3 is greater than the width KW4 (i.e., KW3>KW4), and the length KL3 is greater than the length KL4 (i.e., KL3>KL4). Thus, the area of the dielectric material zones 140*a* is greater than the area of the dielectric material zones 140*b*.

In the transmission line structure 200D, the dielectric material zones 130*a* and the dielectric material zones 140*a*/140*b* are interleaved between the transmission line 10*a* and the conductive line 20*a* along the Y-direction. It should be noted that arrangement of the dielectric material zones 140*a* and 140*b* between the sub-line 14 and the conductive line 20*a* is merely an example and is not intended to limit the transmission line structures.

Figure 6A:
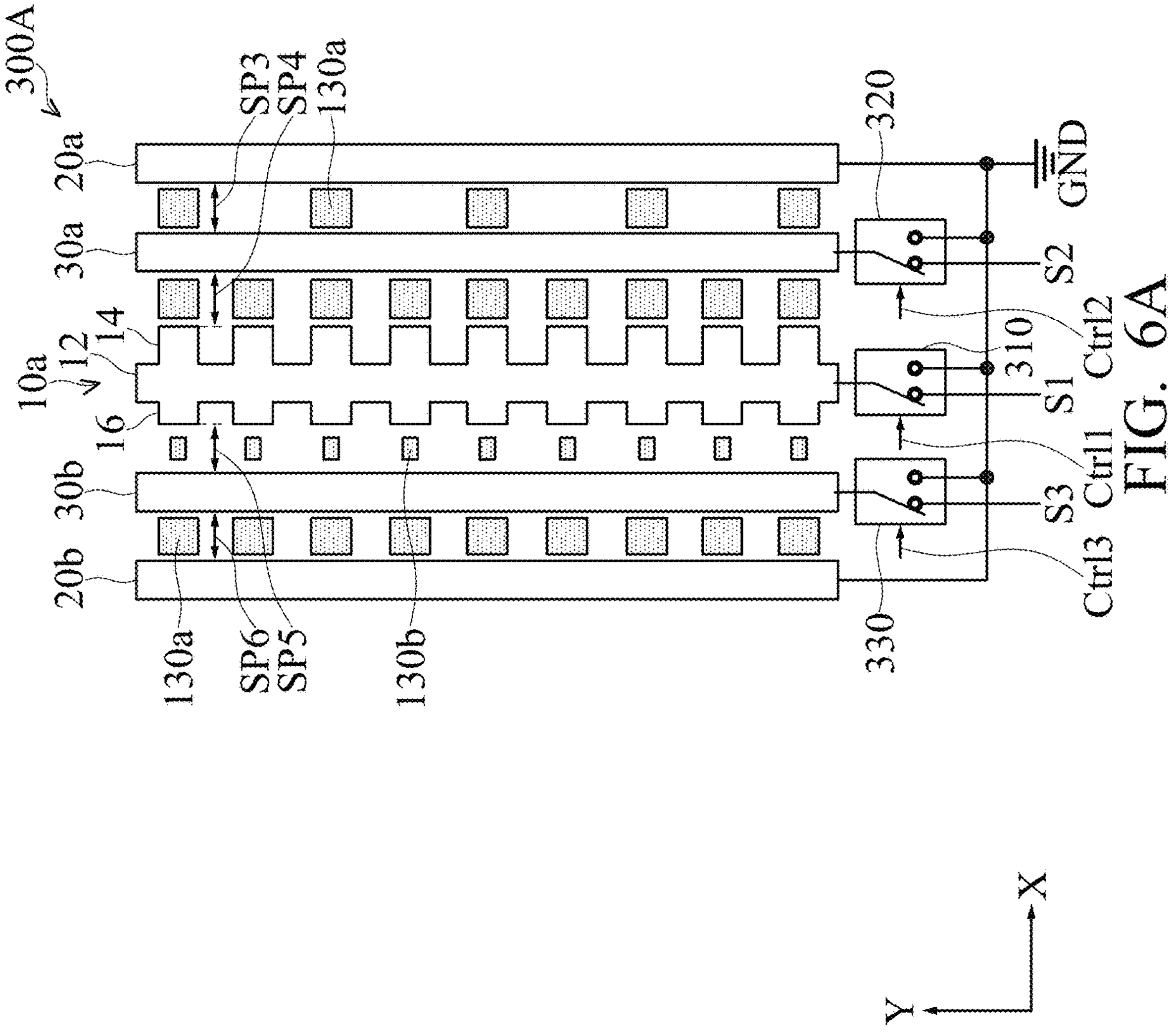
FIG. 6A shows a top view of a transmission line structure, in accordance with some embodiments of the disclosure.

FIG. 6A shows a top view of a transmission line structure 300A, in accordance with some embodiments of the disclosure. Compared with the transmission line structures 200A through 200D, the transmission line structure 300A further includes the transmission lines 30*a* and 30*b* and the switches (or selectors) 310 through 330. The switches 310 through 330 are formed in the semiconductor substrate 110 of FIG. 2B.

In transmission line structure 300A, the transmission lines 30*a* and 30*b* and the conductive lines 20*a* and 20*b* have the same shape that is different from the shape of the transmission line 10*a*. In such embodiment, the transmission lines 30*a* and 30*b* are the linear lines and the transmission line 10*a* is the non-linear line. Furthermore, the conductive lines 20*a* and 20*b* are the linear lines. As described above, the conductive lines 20*a* and 20*b* are coupled to the ground GND, i.e., the conductive lines 20*a* and 20*b* are ground lines.

The transmission line 30*a* is disposed between the transmission line 10*a* and the conductive line 20*a*, and the transmission line 30*b* is disposed between the transmission line 10*a* and the conductive line 20*b*. The transmission line 10*a*, the conductive lines 20*a* and 20*b*, and the transmission lines 30*a* and 30*b* are separated by an insulation material layer (e.g., the insulation material layer 120 in FIG. 2B). The space between the transmission line 30*a* and the conductive line 20*a* is SP3, the space between the sub-line 14 and the transmission line 30*a* is SP4, the space between the sub-line 16 and the transmission line 30*b* is SP5, and the space between the transmission line 30*b* and the conductive line 20*b* is SP6. In some embodiments, the spaces SP3 through SP6 are the same. In some embodiments, the spaces SP3 through SP6 are different.

The dielectric material zones 130*a* with the larger area are disposed between the transmission line 30*b* and the conductive line 20*b*, between the transmission line 10*a* and the transmission line 30*a*, and between the transmission line 30*a* and the conductive line 20*a*. The dielectric material zones 130*b* with the smaller area are disposed between the transmission lines 10*a* and 30*b*. In such embodiment, the number of dielectric material zones 130*a* between the transmission line 30*a* and the conductive line 20*a* is less than the number of dielectric material zones 130*a* between the transmission lines 30*a* and 10*a* or between the transmission line 30*b* and the conductive line 20*b*. Moreover, the number of dielectric material zones 130*b* between the transmission lines 30*b* and 10*a* is equal to the number of dielectric material zones 130*a* between the transmission lines 30*a* and 10*a* or between the transmission lines 30*b* and 20*b*.

The switch 310 is coupled to the transmission line 10*a*, and the switch 310 is controlled by a control signal Ctrl1. In response to the control signal Ctrl1, the switch 310 is configured to selectively connect the transmission line 10*a* to the wave source (not shown) for receiving the radio frequency (RF) signal S1 or to the ground GND for grounding. The switch 320 is coupled to the transmission line 30*a*, and the switch 320 is controlled by a control signal Ctrl2. In response to the control signal Ctrl2, the switch 320 is configured to selectively connect the transmission line 30*a* to the wave source (not shown) for receiving the RF signal S2 or to the ground GND for grounding. The switch 330 is coupled to the transmission line 30*b*, and the switch 330 is controlled by a control signal Ctrl3. In response to the control signal Ctrl3, the switch 330 is configured to selectively connect the transmission line 30*b* to the wave source (not shown) for receiving the RF signal S3 or to the ground GND for grounding.

The control signals Ctrl1, Ctrl2 and Ctrl3 are provided by a controller (not shown), and the controller and the transmission line structure are implemented in the same semiconductor device. In some embodiments, the RF signals S1, S2 and S3 are different. In some embodiments, the RF signals S1, S2 and S3 are the same or signals are correlated.

FIG. 6B shows a wavelength table of the transmission line structure 300A of FIG. 6A, in accordance with some embodiments of the disclosure. In the table of FIG. 6B, by controlling the connection configurations of the switches 310, 320 and 330, seven wavelengths $\lambda\_a_1$ through $\lambda\_a_7$ are obtained.

Referring to FIG. 6A and FIG. 6B together, each of the switches 310, 320 and 330 is configured to operate in an "ON" state or a "ground" state according to the corresponding control signal (e.g., the control signal Ctrl1, Ctrl2 or Ctrl3). Taking the switch 310 as an example, in the "ON" state, the switch 310 is configured to connect the transmission line 10*a* to the wave source (not shown), thus the RF signal S1 is provided to the transmission line 10*a*. Conversely, in the "ground" state, the switch 310 is configured to connect the transmission line 10*a* to the ground GND, thus the transmission line 10*a* is grounded.

When the switches 310, 320 and 330 are operated in the "ON" state, the RF signals S1, S2 and S3 are respectively provided to the transmission lines 10*a*, 30*a* and 30*b*, thus the wavelength λ is adjusted to $\lambda\_a_1$.

When the switches 310 and 330 are operated in the "ON" state and the switch 320 is operated in the "ground" state, the RF signals S1 and S3 are respectively provided to the transmission lines 10*a* and 30*b* and the transmission line 30*a* is grounded, thus the wavelength λ is adjusted to $\lambda\_a_2$. Furthermore, when the transmission line 30*a* is grounded through the switch 320, the transmission line 30*a* may function as the ground line for the transmission line 10*a*.

When the switches 320 and 330 are operated in the "ON" state and the switch 310 is operated in the "ground" state, the RF signals S2 and S3 are respectively provided to the transmission lines 30*a* and 30*b* and the transmission line 10*a* is grounded, thus the wavelength λ is adjusted to $\lambda\ \_a_3$.

When the switches 310 and 320 are operated in the "ON" state and the switch 330 is operated in the "ground" state, the RF signals S1 and S2 are respectively provided to the transmission lines 10*a* and 30*a* and the transmission line 30*b* is grounded, thus the wavelength λ is adjusted to $\lambda\_a_4$. Furthermore, when the transmission line 30*b* is grounded through the switch 330, the transmission line 30*b* may function as the ground line for the transmission line 10*a*.

When the switch 330 is operated in the "ON" state and the switches 310 and 320 are operated in the "ground" state, the RF signal S3 is provided to the transmission line 30*b* and the transmission lines 10*a* and 30*a* are grounding, thus the wavelength A is adjusted to $\lambda\ \_a_5$.

When the switch 320 is operated in the "ON" state and the switches 310 and 330 are operated in the "ground" state, the RF signal S2 is provided to the transmission line 30*a* and the transmission lines 10*a* and 30*b* are grounding, thus the wavelength A is adjusted to $\lambda\ \_a_6$.

When the switch 310 is operated in the "ON" state and the switches 320 and 330 are operated in the "ground" state, the RF signal S1 is provided to the transmission line 10*a* and the transmission lines 30*a* and 30*b* are grounding, thus the wavelength A is adjusted to A $a_7$.

Therefore, in the transmission line structure 300A, the wavelength λ can be adjusted from $\lambda\_a_7$ to $\lambda\_a_1$ by controlling the connection configurations of the switches 310, 320 and 330 (i.e., the operation state of the witches 310, 320 and 330).

As shown in FIG. 6B, by controlling the connection configurations of the switches (e.g., the selective on/off combination of the signal line) and different implant processes of the dielectric material zones, the tunable high-impedance section is obtained for the transmission line structure 300A.

Figure 7A:
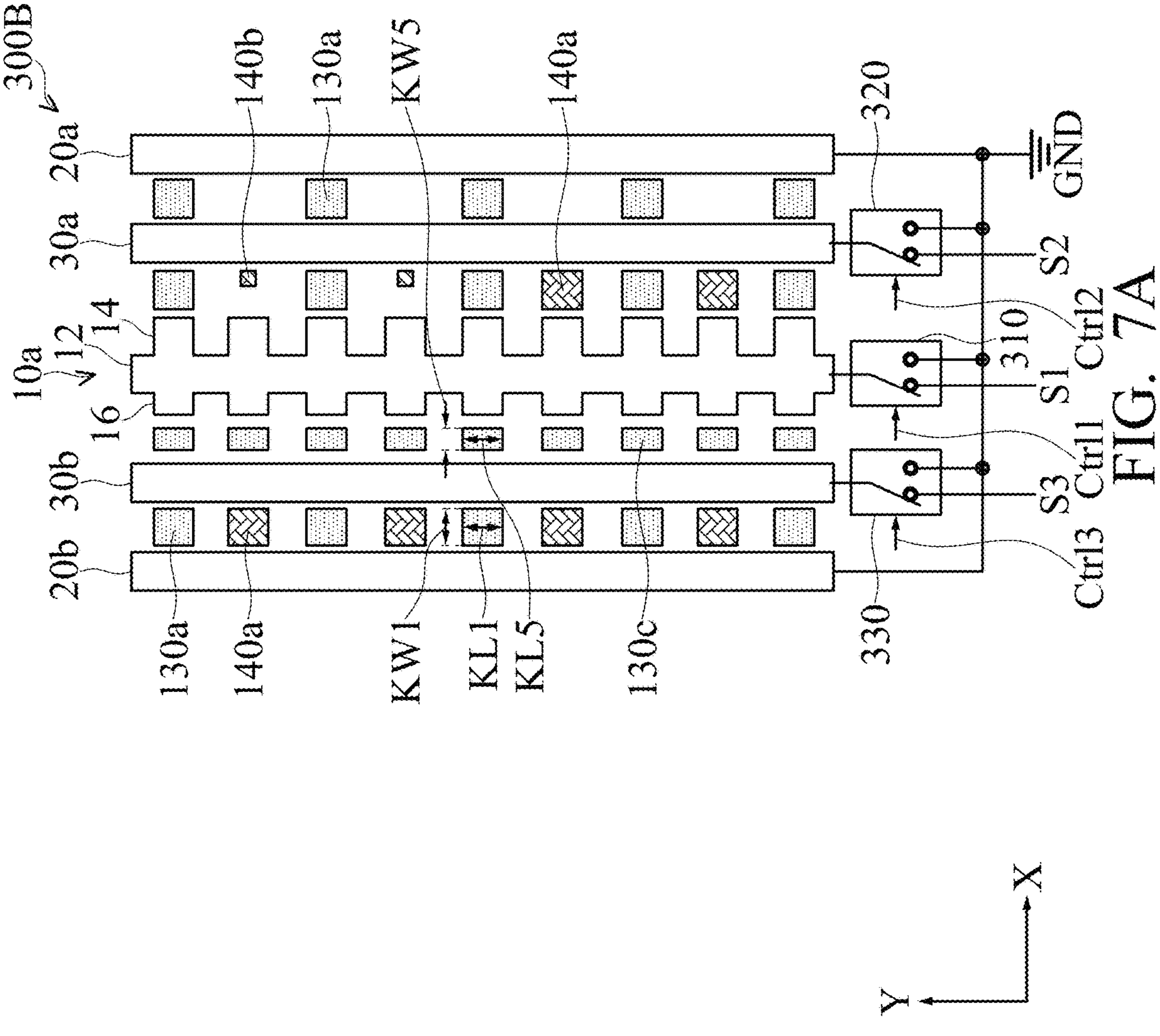
FIG. 7A shows a top view of a transmission line structure, in accordance with some embodiments of the disclosure.

FIG. 7A shows a top view of a transmission line structure 300B, in accordance with some embodiments of the disclosure. The configuration of the transmission line structure 300B in FIG. 7A is similar with the configuration of the transmission line structure 300A in FIG. 6A. The difference between the transmission line structure 300A in FIG. 6A and the transmission line structure 300B in FIG. 7A is that the transmission line structure 300B further includes the dielectric material zones 130*c* and the dielectric material zones 140*a* and 140*b*.

In FIG. 7A, the dielectric material zones 130*a* and 130*c* are formed by a first high-k dielectric material, and the dielectric material zones 140*a* and 140*b* are formed by a second high-k dielectric material. In some embodiments, the dielectric constant of the first high-k dielectric material is less than the dielectric constant of the second high-k dielectric material. For example, the dielectric constant of the first high-k dielectric material is between 7 and 15, and the dielectric constant of the first high-k dielectric material is greater than 15. In some embodiments, the dielectric constant of the first high-k dielectric material is greater than the dielectric constant of the second high-k dielectric material. For example, the dielectric constant of the first high-k dielectric material is greater than 15, and the dielectric constant of the first high-k dielectric material is between 7 and 15.

The dielectric material zones 130*c* have a width KW5 in the X-direction and a length KL5 in the Y-direction. In such embodiment, the width KW1 is greater than the width KW5 (i.e., KW1>KW5), and the length KL1 is greater than or equal to the length KL3 (i.e., KL1>KL5). Thus, the area of the dielectric material zones 130*a* is greater than the area of the dielectric material zones 130*c*.

In FIG. 7A, the dielectric material zones 130*a* and 140*a* are interleaved between the transmission line 30*b* and the conductive line 20*b* along the Y-direction. The dielectric material zones 130*c* are disposed between the transmission lines 30*b* and 10*a*. The dielectric material zones 130*a* and the dielectric material zones 140*a*/140*b* are interleaved between the transmission lines 30*a* and 10*a* along the Y-direction. The dielectric material zones 130*a* are disposed between the transmission line 30*a* and the conductive line 20*a*.

In the transmission line structure 300B, the wavelength λ can be adjusted by controlling the connection configurations of the switches 310, 320 and 330. Referring to FIG. 7B, FIG. 7B shows a wavelength table of the transmission line structure 300B of FIG. 7A, in accordance with some embodiments of the disclosure. In the table of FIG. 7B, by controlling the connection configurations of the three switches 310, 320 and 330, seven wavelengths $\lambda\_b_1$ through $\lambda\_b_7$ are obtained.

Figure 8A:
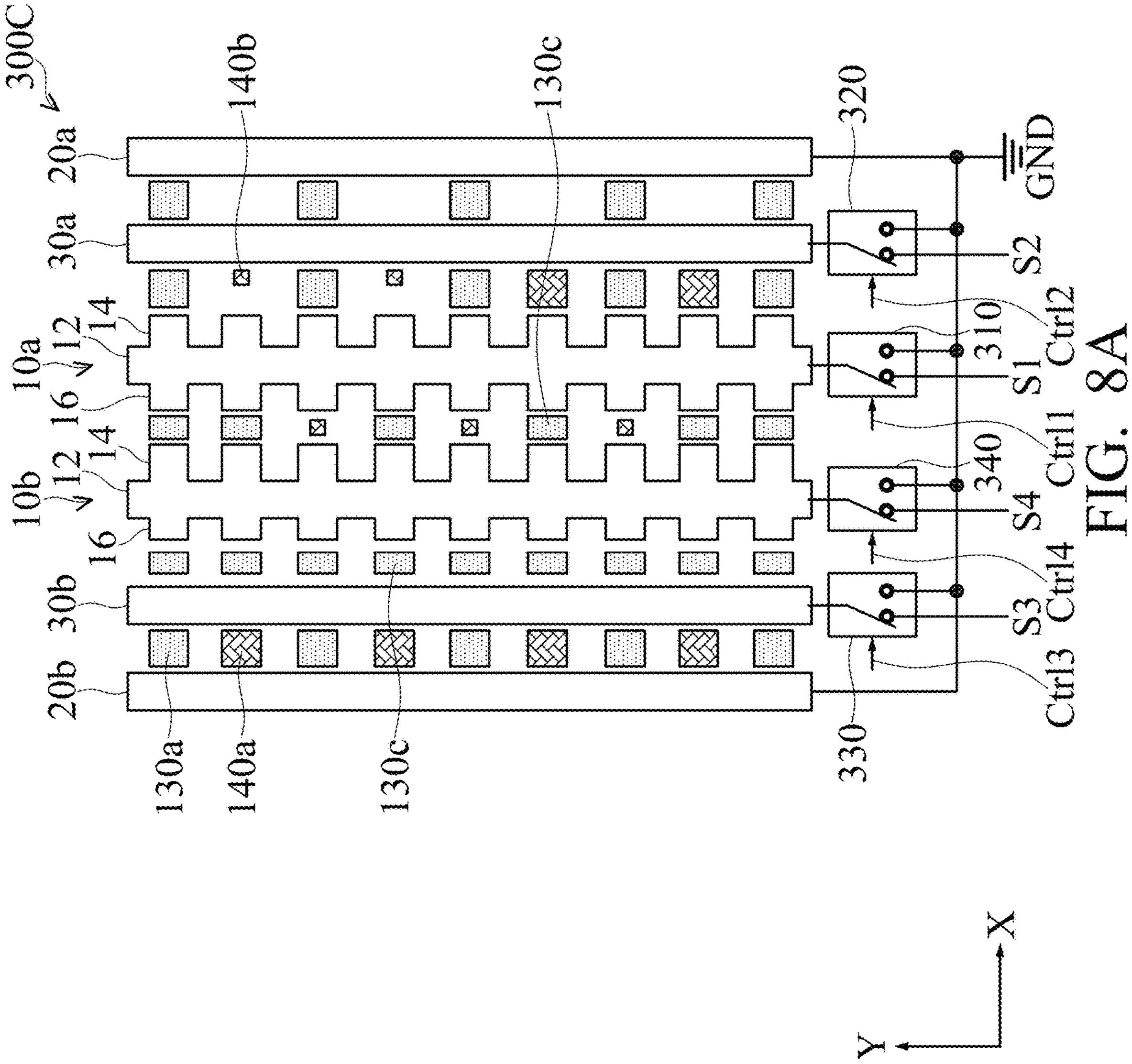
FIG. 8A shows a top view of a transmission line structure, in accordance with some embodiments of the disclosure.

FIG. 8A shows a top view of a transmission line structure 300C, in accordance with some embodiments of the disclosure. The configuration of the transmission line structure 300C in FIG. 8A is similar with the configuration of the transmission line structure 300B in FIG. 7A. The difference between the transmission line structure 300B in FIG. 7A and the transmission line structure 300C in FIG. 8A is that the transmission line structure 300C further includes the transmission line 10*b* and the corresponding switch (or the selector) 340.

Similar to the transmission line 10*a*, the transmission line 10*b* is the non-linear line. The transmission line 10*b* has a periodic structure formed by the sub-line 12, the sub-lines 14 periodically arranged to the right of the sub-line 12, and the sub-lines 16 periodically arranged to the left of the sub-line 12. As described above, for the transmission line 10*b*, the sub-line 14 and the sub-line 16 may have the same area. In such embodiment, the sub-line 14 and the sub-line 16 have the different areas.

In FIG. 8A, the dielectric material zones 130*c* and 140*b* are disposed between the transmission lines 10*a* and 10*b*. Moreover, the switch 340 is connected to the transmission line 10*b*. The switch 340 is configured to operate in an "ON" state or a "ground" state according to the control signal Ctrl4. In the "ON" state, the switch 340 is configured to connect the transmission line 10*b* to the wave source (not shown), thus the RF signal S4 is provided to the transmission line 10*b*. Conversely, in the "ground" state, the switch 340 is configured to connect the transmission line 10*b* to the ground GND, thus the transmission line 10*b* is grounded.

In the transmission line structure 300C, the wavelength λ can be adjusted by controlling the connection configurations of the switches 310, 320, 330 and 340. As shown in FIG. 8, FIG. 8B shows a wavelength table of the transmission line structure 300C of FIG. 8A, in accordance with some embodiments of the disclosure. In the table of FIG. 8B, by controlling the connection configurations of the four switches 310, 320, 330 and 340, fifteen wavelengths $\lambda\_c_1$ through $\lambda\_c_{15}$ are obtained.

The transmission line structures disclosed herein may be formed using well-known semiconductor manufacturing processes. Moreover, the transmission line structures disclosed herein may be used in many products, including but not limited to items such as integrated circuits, monolithic microwave integrated circuits, radio frequency transmitters and receivers, radio frequency communication equipment, antennas, circuit boards, amplifiers, modulators, and demodulators.

Embodiments of the transmission line structures are provided. By using dielectric material zones with high-k dielectric materials between the transmissions and the ground lines in the transmission line structure, a higher permittivity epsilon $\varepsilon'_r$ and lower phase velocity speed Vp of the transmission line structure as compared to conventional transmission line module. Furthermore, by switching the connection configurations of the switches connected to the respective transmission lines, the wavelength λ can be adjusted. Therefore, compared with conventional transmission line modules with constant dielectric material, the transmission line structures in the disclosure can fulfill small form factor package due to the variable dielectric material (e.g., the dielectric material zones 130*a* through 130*c* and 140*a* through 140*b*) inside.

In some embodiments, a device is provided. The device includes a first conductive line and a second conductive line, a first transmission line formed in the metal layer and between the first and second conductive lines, a plurality of first dielectric material zones, a plurality of second dielectric material zones, and a plurality of third dielectric material zones. The first and second conductive lines extend in a first direction. The first transmission line includes a first sub-line extending in the first direction, a plurality of second sub-lines perpendicular to the first sub-line and extending toward the first conductive line, and a plurality of third sub-lines perpendicular to the first sub-line and extending toward the second conductive line. The first dielectric material zones are formed between the first transmission line and the first conductive line. The second sub-lines include a first group, a second group, and a third group. The first dielectric material zones are disposed between the second sub-lines of the first group and the first conductive line. The second dielectric material zones are formed between the first transmission line and the first conductive line. The second dielectric material zones are disposed between the second sub-lines of the second group and the first conductive line. The third dielectric material zones are formed between the first transmission line and the first conductive line. The third dielectric material zones are disposed between the second sub-lines of the third group and the first conductive line. The second sub-lines of the first group and the second sub-lines of the second group are interleaved along a first segment of the first sub-line in the first direction. The second sub-lines of the first group and the second sub-lines of the third group are interleaved along a second segment of the first sub-line in the first direction. The material of the first dielectric material zones is different than the materials of the second and third dielectric material zones. The first and second conductive lines and the first transmission line are separated from each other by an insulation material, and the first and second dielectric material zones are separated from the first and second conductive lines and the first transmission line by the insulation material.

In some embodiments, a device is provided. The device includes a first ground line and a second ground line, a first transmission line and a second transmission line formed in a metal layer, a plurality of first dielectric material zones, a plurality of second dielectric material zones, a plurality of third dielectric material zones, and a plurality of fourth dielectric material zones. The first and second ground lines extend in a first direction. The first transmission line is formed in the metal layer and between the first and second ground lines. The first transmission line is divided into a first sub-line extending in the first direction, a plurality of second sub-lines extending toward the first ground line along a second direction, and a plurality of third sub-lines extending toward the second ground line along the second direction, and the first direction is perpendicular to the second direction. The second transmission line is formed in the metal layer and between the first ground line and the first transmission line. The plurality of first dielectric material zones are formed between the first and second transmission lines. The second sub-lines include a first group, a second group, and a third group. The first dielectric material zones are disposed between the second sub-lines of the first group and the second transmission line. The plurality of second dielectric material zones are formed between the first and second transmission lines. The second dielectric material zones are disposed between the second sub-lines of the second group and the second transmission line. The plurality of third dielectric material zones are formed between the first and second transmission lines. The third dielectric material zones are disposed between the second sub-lines of the third group and the second transmission line. The plurality of fourth dielectric material zones are formed between the second transmission line and the first ground line. The second sub-lines of the first group and the second sub-lines of the second group are interleaved along a first segment of the first sub-line in the first direction. The second sub-lines of the first group and the second sub-lines of the third group are interleaved along a second segment of the first sub-line in the first direction. The first and second dielectric material zones are separated from the first and second ground lines and the first and second transmission lines by an insulation material.

In some embodiments, a device is provided. The device includes a first conductive line, a first non-linear transmission line, a second non-linear line, a first linear transmission line, an insulation material layer, a plurality of first dielectric material zones, a plurality of second dielectric material zones, a plurality of third dielectric material zones, and a plurality of fourth dielectric material zones. The first conductive line extends in a first direction. The second non-linear transmission line is formed between the first non-linear transmission line and the first conductive line. The first non-linear transmission line includes a first sub-line extending in the first direction and a plurality of second sub-lines extending toward the second non-linear transmission line along a second direction that is perpendicular to the first direction. The second non-linear transmission line includes a third sub-line extending in the first direction, a plurality of fourth sub-lines extending toward the second non-linear transmission line along the second direction, and a plurality of fifth sub-lines extending toward the first conductive line along the second direction. The first linear transmission line is formed between the second non-linear transmission line and the first conductive line. The first conductive line, the first and second non-linear transmission lines, and the first linear transmission line are separated from each other by the insulation material layer. The plurality of first dielectric material zones and the plurality of second dielectric material zones are formed in the insulation material layer and between the second sub-lines and the fourth sub-lines. The first and second dielectric material zones are interleaved along a middle segment of the first sub-line in the first direction, and wherein the number of the first dielectric material zones is greater than the number of the second dielectric material zones. The plurality of third dielectric material zones and the plurality of fourth dielectric material zones are formed in the insulation material layer and between the first linear transmission line and the first conductive line. The third and fourth dielectric material zones are interleaved along the first direction and have different dielectric materials.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a first conductive line and a second conductive line formed in a metal layer and extending in a first direction;

a first transmission line formed in the metal layer and between the first and second conductive lines, wherein the first transmission line comprises a first sub-line extending in the first direction, a plurality of second sub-lines perpendicular to the first sub-line and extending toward the first conductive line, and a plurality of third sub-lines perpendicular to the first sub-line and extending toward the second conductive line;

a plurality of first dielectric material zones formed between the first transmission line and the first conductive line, wherein the second sub-lines comprise a first group, a second group, and a third group, and wherein the first dielectric material zones are disposed between the second sub-lines of the first group and the first conductive line;

a plurality of second dielectric material zones formed between the first transmission line and the first conductive line, wherein the second dielectric material zones are disposed between the second sub-lines of the second group and the first conductive line; and a plurality of third dielectric material zones formed between the first transmission line and the first conductive line, wherein the third dielectric material zones are disposed between the second sub-lines of the third group and the first conductive line, wherein the second sub-lines of the first group and the second sub-lines of the second group are interleaved along a first segment of the first sub-line in the first direction, and wherein the second sub-lines of the first group and the second sub-lines of the third group are interleaved along a second segment of the first sub-line in the first direction, wherein a material of the first dielectric material zones is different than materials of the second and third dielectric material zones, wherein the first and second conductive lines and the first transmission line are separated from each other by an insulation material, and the first and second dielectric material zones are separated from the first and second conductive lines and the first transmission line by the insulation material.

2. The device as claimed in claim 1, wherein the number of second sub-lines is greater than the number of first dielectric material zones, the number of second dielectric material zones, and the number of third dielectric material zones.

3. The device as claimed in claim 1, further comprising:

a plurality of fourth dielectric material zones formed between the first transmission line and the second conductive line, wherein the third sub-lines comprise a fourth group and a fifth group, and wherein the fourth dielectric material zones are disposed between the third sub-lines of the fourth group and the second conductive line; and a plurality of fifth dielectric material zones formed between the first transmission line and the second conductive line, wherein the fifth dielectric material zones are disposed between the third sub-lines of the fifth group and the second conductive line.

4. The device as claimed in claim 3, wherein the fourth dielectric material zones and the fifth dielectric material zones are interleaved along the first direction.

5. The device as claimed in claim 1, further comprising:

a second transmission line formed in the metal layer and between the first and second conductive lines and extending in the first direction;

a first switch connected to the first transmission line; and a second switch connected to the second transmission line, wherein the first and second conductive lines are ground lines, wherein when the first switch is turned on, a first radio frequency (RF) signal is applied to the first transmission line, and when the second switch is turned on, a second RF signal is applied to the second transmission line.

6. The device as claimed in claim 1, wherein area of the second sub-line is larger than or equal to area of the third sub-line.

7. The device as claimed in claim 1, wherein the second and third dielectric material zones have the same dielectric constant, and area of the second dielectric material zone is less than area of the third dielectric material zone.

8. A device, comprising:

a first ground line and a second ground line formed in a metal layer and extending in a first direction;

a first transmission line formed in the metal layer and between the first and second ground lines, wherein the first transmission line is divided into a first sub-line extending in the first direction, a plurality of second sub-lines extending toward the first ground line along a second direction, and a plurality of third sub-lines extending toward the second ground line along the second direction, and the first direction is perpendicular to the second direction;

a second transmission line formed in the metal layer and between the first ground line and the first transmission line;

a plurality of first dielectric material zones formed between the first and second transmission lines, wherein the second sub-lines comprise a first group, a second group, and a third group, and wherein the first dielectric material zones are disposed between the second sub-lines of the first group and the second transmission line;

a plurality of second dielectric material zones formed between the first and second transmission lines, wherein the second dielectric material zones are disposed between the second sub-lines of the second group and the second transmission line;

a plurality of third dielectric material zones formed between the first and second transmission lines, wherein the third dielectric material zones are disposed between the second sub-lines of the third group and the second transmission line; and a plurality of fourth dielectric material zones formed between the second transmission line and the first ground line, wherein the second sub-lines of the first group and the second sub-lines of the second group are interleaved along a first segment of the first sub-line in the first direction, and wherein the second sub-lines of the first group and the second sub-lines of the third group are interleaved along a second segment of the first sub-line in the first direction, wherein the first and second dielectric material zones are separated from the first and second ground lines and the first and second transmission lines by an insulation material.

9. The device as claimed in claim 8, further comprising:

a third transmission line formed in the metal layer and between the second ground line and the first transmission line; and a plurality of fifth dielectric material zones and a plurality of sixth dielectric material zones formed between the third transmission line and the second ground line, wherein the fifth and sixth dielectric material zones are interleaved along the first direction and have different dielectric materials.

10. The device as claimed in claim 9, further comprising a plurality of seventh dielectric material zones formed between the third sub-lines and the third transmission line.

11. The device as claimed in claim 10, wherein the first and seventh dielectric material zones have the same dielectric constant, and area of the first dielectric material zone is larger than area of the seventh dielectric material zone.

12. The device as claimed in claim 8, wherein area of the second sub-line is larger than or equal to area of the third sub-line.

13. The device as claimed in claim 8, wherein the first and second dielectric material zones have different dielectric constants, and area of the first dielectric material zone is different from area of the second dielectric material zone.

14. The device as claimed in claim 8, wherein dielectric constants of the second and third dielectric material zones are greater than that of the first and fourth dielectric material zones.

15. A device, comprising:

a first conductive line extending in a first direction;

a first non-linear transmission line;

a second non-linear transmission line formed between the first non-linear transmission line and the first conductive line, wherein the first non-linear transmission line comprises a first sub-line extending in the first direction and a plurality of second sub-lines extending toward the second non-linear transmission line along a second direction that is perpendicular to the first direction, and wherein the second non-linear transmission line comprises a third sub-line extending in the first direction, a plurality of fourth sub-lines extending toward the second non-linear transmission line along the second direction, and a plurality of fifth sub-lines extending toward the first conductive line along the second direction;

a first linear transmission line formed between the second non-linear transmission line and the first conductive line;

an insulation material layer, wherein the first conductive line, the first and second non-linear transmission lines, and the first linear transmission line and the transmission lines are separated from each other by the insulation material layer;

a plurality of first dielectric material zones and a plurality of second dielectric material zones formed in the insulation material layer and between the second sub-lines and the fourth sub-lines, wherein the first and second dielectric material zones are interleaved along a middle segment of the first sub-line in the first direction, and wherein the number of the first dielectric material zones is greater than the number of the second dielectric material zones; and a plurality of third dielectric material zones and a plurality of fourth dielectric material zones formed in the insulation material layer and between the first linear transmission line and the first conductive line, wherein the third and fourth dielectric material zones are interleaved along the first direction and have different dielectric materials.

16. The device as claimed in claim 15, further comprising a plurality of fifth dielectric material zones formed in the insulation material layer and between the fifth sub-lines and the first linear transmission line.

17. The device as claimed in claim 16, wherein the number of the fifth dielectric material zones is greater than the number of the third dielectric material zones and the number of the fourth dielectric material zones.

18. The device as claimed in claim 15, further comprising a second conductive line extending in the first direction, wherein the first and second non-linear transmission lines and the first linear transmission line are disposed between the first and second conductive lines.

19. The device as claimed in claim 18, further comprising:

a second linear transmission line formed between the first non-linear transmission line and the second conductive line; and a plurality of sixth dielectric material zones formed in the insulation material layer and between the second conductive line and the second linear transmission line.

20. The device as claimed in claim 15, wherein dielectric constant or area of the first dielectric material zone is different from that of the second dielectric material zone.

* * * * *